United States Patent
Tseng et al.

(10) Patent No.: US 7,400,011 B2
(45) Date of Patent: Jul. 15, 2008

(54) NON-VOLATILE MEMORY DEVICE HAVING A NITRIDE BARRIER TO REDUCE THE FAST ERASE EFFECT

(75) Inventors: Uway Tseng, Hsinchu (TW); Wenpin Lu, Hsinchu (TW); Chun-Lien Su, Hsinchu (TW)

(73) Assignee: Macronix International Co. Ltd, Hsinchu (TW)

( * ) Notice: Subject to any disclaimer, the term of this patent is extended or adjusted under 35 U.S.C. 154(b) by 0 days.

(21) Appl. No.: 11/715,217

(22) Filed: Mar. 6, 2007

(65) Prior Publication Data

US 2007/0155100 A1   Jul. 5, 2007

Related U.S. Application Data

(62) Division of application No. 10/806,052, filed on Mar. 22, 2004, now Pat. No. 7,199,007.

(51) Int. Cl.
    *H01L 29/788* (2006.01)
(52) U.S. Cl. .............................. 257/316; 257/E27.179
(58) Field of Classification Search ......... 438/257–267; 257/316–321, E21.179
    See application file for complete search history.

(56) References Cited

U.S. PATENT DOCUMENTS

| | | | | |
|---|---|---|---|---|
| 5,420,060 | A * | 5/1995 | Gill et al. | 438/261 |
| 6,200,858 | B1 * | 3/2001 | Kokubu | 438/261 |
| 6,414,351 | B2 * | 7/2002 | Clampitt et al. | 257/315 |
| 6,706,594 | B2 * | 3/2004 | Hurley | 438/258 |

* cited by examiner

*Primary Examiner*—Richard A. Booth
(74) *Attorney, Agent, or Firm*—Stout, Uxa, Buyan & Mullins, LLP

(57) ABSTRACT

A method is provided for forming a non-volatile memory device. The method includes forming a stacked structure including a tunnel oxide layer, a floating gate, a thin oxide layer, and a control gate on a semiconductor substrate. Etching is used to define the sidewalls of the stacked structure. Dopants are implanted into exposed areas of the substrate to form source and drain regions within the substrate adjacent to the stacked structure. A liner dielectric layer is formed on the sidewalls of the stacked structure to patch the etching damage. Thereafter, a nitride barrier layer is formed on the liner dielectric layer, and an oxide spacer is formed on the nitride barrier layer. The nitride barrier layer can trap negative charge and thus act as a relatively high barrier at the tunneling oxide edge. Therefore, the threshold voltage difference between the initial erase of the memory device and the erase after many cycles is reduced.

13 Claims, 4 Drawing Sheets

NON-VOLATILE MEMORY DEVICE HAVING A NITRIDE BARRIER TO REDUCE THE FAST ERASE EFFECT

CROSS-REFERENCE TO RELATED APPLICATIONS

This application is a divisional of U.S. Application Number 10/806,052, filed Mar. 22, 2004, now U.S. Pat. No. 7,199,007 the entire contents of which are hereby incorporated by reference.

BACKGROUND OF THE INVENTION

1. Field of the Invention

The present invention relates generally to semiconductor fabrication methods and, more particularly, to methods for fabricating a non-volatile memory device having a silicon nitride barrier layer to reduce the fast erase effect.

2. Description of Related Art

Semiconductor devices typically include multiple individual components formed on or within a substrate. One such component is a memory device, which is used to store electronic data such as computer programs executed by an electronic processor and logical data operated on by the processor. Memory devices that do not require ambient power to store electronic data are commonly referred to as non-volatile memory devices. Flash memory is a specific form of non-volatile memory by which bits of logical data are stored in units of memory known as memory cells. A grouping of memory cells can be termed a word, a grouping of words can be termed a page, and a grouping of pages can be termed a sector. Data can be accessed for reading and programming by word or page, while an entire sector is commonly accessed for erasing.

A conventional flash memory cell includes a transistor characterized by a programmable threshold voltage $V_T$. The transistor's threshold voltage can be set, or programmed, to a desired value along an analog scale between the maximum and minimum threshold voltage limits that are determined based on the design parameters for the transistor. The transistor typically comprises a stacked gate structure on a semiconductor substrate. The stacked gate structure includes a relatively thin tunnel oxide (i.e., silicon dioxide) that overlies the substrate. It also includes a doped polysilicon floating gate that overlies the tunnel oxide and an interpoly dielectric that overlies the floating gate. Lastly, a doped polysilicon control gate overlies the interpoly dielectric. The transistor also comprises source and drain regions that are self-aligned to the sidewalls of the stacked gate structure.

In general, a flash memory cell can be programmed by inducing electron injection from the drain region to the floating gate. Electrons pass through the tunnel oxide to the floating gate by a mechanism known as Fowler-Nordheim tunneling. After sufficient negative charge accumulates on the floating gate, the negative potential of the floating gate raises the threshold voltage of the associated field effect transistor (FET) and inhibits current flow through the channel region during a subsequent "read" mode. The act of discharging the floating gate, i.e., the erase function, can be carried out by inducing the electrons stored in the floating gate to move to the source region. There are numerous ways to move electrons to or from the floating gate. For example, the electrons can be electrically drawn or, alternatively, they can be drawn using ultraviolet radiation.

It is desirable for flash memory cells to exhibit consistent erase times. However, when prior art fabrication methods are used, a fast erase effect can occur in which some memory cells erase at a faster rate than others. The fast erase effect is pronounced in the earlier program and erase cycles. In particular, the threshold voltage of the faster-erasing memory cells may be undesirably lower than the threshold voltage of other memory cells. The faster-erasing memory cells thus may overerase, causing current leakage. Excessive leakage currents can have adverse effects on the operation of the flash memory cell. For example, the leakage currents of multiple cells in a column have a summing effect of leakage current on the bit-line and may result in an incorrect data reading. A need thus exists in the prior art to reduce the fast erase effect on memory cells. A further need exists to reduce threshold voltage differences among multiple memory cells between the initial erase and the erase after many cycles.

SUMMARY OF THE INVENTION

The present invention addresses these needs by providing a method for reducing the abnormal fast erase effect. In particular, a nitride (i.e., silicon nitride) barrier layer is formed laterally adjacent to the sidewalls of the stacked gate structure of a memory device. Because the nitride layer has the ability to trap negative charge, the nitride layer acts as a relatively high barrier at the tunneling oxide edge. Therefore, the threshold voltage difference between the initial erase and the erase after many cycles is reduced.

In accordance with one aspect of the invention, a method is provided for forming a non-volatile memory device. A stacked structure comprising a first dielectric that may be a tunnel oxide layer, a floating gate, a second dielectric that may be an oxide-nitride-oxide (ONO) layer, and a control gate is formed upon a semiconductor substrate. The floating gate and the control gate preferably comprise doped polysilicon. Etching is used to define the sidewalls of the stacked structure. Dopants are implanted into exposed areas of the substrate to form source and drain regions within the substrate adjacent to the stacked structure. A liner dielectric layer is formed on the sidewalls of the stacked structure that extends in a direction substantially parallel to the control gate, to patch any etching damage. Thereafter, a nitride barrier layer is formed on the liner dielectric layer. The nitride barrier layer may be formed by, for example, chemical vapor deposition (CVD) of silicon nitride or by performing a nitridation process. Subsequently, an oxide spacer may be formed on the nitride layer. This method can be used to form a plurality of non-volatile memory devices or cells, each having a nitride barrier layer laterally adjacent to its sidewalls.

In accordance with another aspect of the present invention, a non-volatile memory device is provided that includes a stacked gate structure disposed on a substrate. The stacked gate structure comprises a tunnel oxide layer, a floating gate, an ONO layer, and a control gate. Source and drain regions are disposed within the substrate adjacent to the stacked structure. A liner oxide layer resides on the sidewalls of the stacked structure which extend in a direction parallel to the control gate, and a nitride barrier layer resides on the liner oxide layer. The memory device may further include an oxide spacer on the nitride barrier layer.

In the present invention, the presence of the nitride barrier layer provides protection against the fast erase effect by reducing or eliminating current leakage of the memory device. The nitride barrier layer tends to trap negative charge, particularly at the interface between the liner oxide layer and the nitride barrier layer. As such, the nitride barrier layer is strategically placed in the pathway of electrons that could otherwise pass from the floating gate to the source/drain regions. The nitride barrier layer thus forms a "barrier" that traps the electrons before they can reach the source/drain regions, thereby preventing current leakage. In the absence of current leakage, the difference between the memory cell's initial erase and the erase after many cycles is reduced such that the fast erase effect is attenuated or no longer a problem.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

DETAILED DESCRIPTION OF THE PRESENTLY PREFERRED EMBODIMENTS

Figure 1:
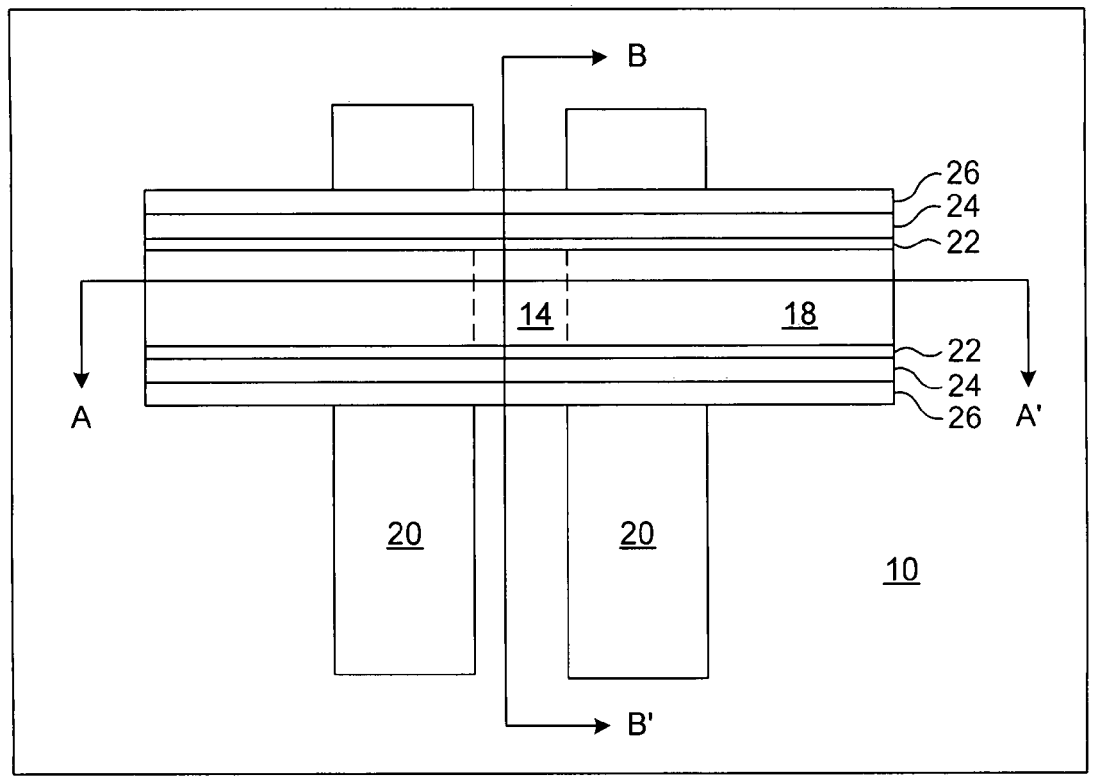
FIG. 1 is a plan view of a memory device having a stacked gate structure according to the present invention.

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not to precise scale. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. For example, it is understood by a person of ordinary skill practicing this invention that the fabrication method in accordance with the present invention includes forming a memory device having a nitride barrier layer adjacent to the sidewalls of the stacked gate structure. Hence, the nitride barrier layer may be formed using different processing techniques than those described herein in exemplary embodiments. Moreover, the particular materials used to form the stacked gate structure may be different from those described herein in exemplary embodiments. Thus, different fabrication techniques and different materials can be implemented in accordance with the present invention.

It is to be understood and appreciated that the process steps and structures described herein do not cover a complete process flow for the manufacture of an integrated circuit. The present invention may be practiced in conjunction with various integrated circuit fabrication techniques that are conventionally used in the art, and only so much of the commonly practiced process steps are included herein as are necessary to provide an understanding of the present invention.

With reference to the drawings, FIGS. 1-6 illustrate the formation of a memory device having a nitride barrier layer laterally adjacent to a stacked gate structure for reducing the fast erase effect. FIG. 1 is a plan view of an example of a memory device having a stacked gate structure formed on a substrate 10 according to the present invention. The memory device in the illustrated embodiment may be embedded in a rectangular memory array that comprises a large number of such devices. A typical memory array comprises bit lines that coincide with source and drain regions 20 of memory devices in columns of the memory array. The source/drain regions 20 may be formed of buried diffusions in a substrate as shown, for example, in FIG. 2. A typical memory array further may comprise word lines coinciding with control gates 18 of memory devices in rows of the memory array. A stacked gate structure 8 (FIG. 6) may include, for example, a liner dielectric 22, a nitride barrier layer 24, a dielectric spacer 26, and a floating gate 14 as are more particularly described below. Two planes A-A' and B-B', corresponding to cross-sectional views of the memory device, are illustrated in FIG. 1. These cross-sections are described more fully in that which follows.

Figure 2:
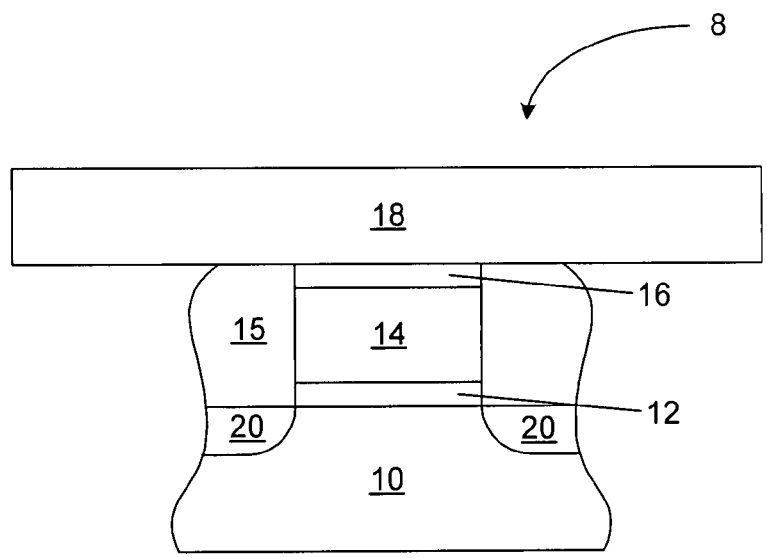
FIG. 2 is a cross-sectional view taken along the line A-A' of the stacked gate memory device of FIG. 1.

FIG. 2 is a cross-sectional view, taken along section A-A' of FIG. 1, showing a stacked structure 8 formed on a substrate 10. Although substrate 10 preferably comprises single crystalline silicon, in alternative embodiments substrate 10 can comprise materials such as gallium nitride (GaN), gallium arsenide (GaAs), polysilicon, or other materials commonly recognized as suitable semiconductor materials by those skilled in the art. Substrate 10 may be slightly doped with p-type dopants (e.g., arsenic, phosphorus, and antimony) or n-type dopants (e.g., boron and boron difluoride). Although not shown in the depicted cross-section of substrate 10, in some embodiments dielectric isolation regions such as trench isolation structures may be arranged spaced distances apart within the substrate for isolating ensuing active areas (e.g., source/drain regions).

As presently embodied, stacked gate structure 8 includes a first dielectric layer comprising a tunnel oxide 12 disposed upon substrate 10. Tunnel oxide 12 may comprise any suitable insulating material known in the art. Preferably, tunnel oxide 12 comprises a tunnel oxide layer that may be formed by heating preferred silicon-based substrate 10 in the presence of an oxygen-containing gas (i.e., thermal oxidation). A floating gate 14 comprising any suitable conductive or semiconductive material known in the art is formed across tunnel oxide 12. Floating gate 14 can be formed, for example, by depositing polysilicon via chemical vapor deposition (CVD) from a silane ($SiH_4$) source, followed by implanting dopants into the polysilicon to lower its resistivity.

Stacked gate structure 8 further includes a second dielectric layer 16 overlying floating gate 14. The second dielectric layer 16 may comprise a conventional oxide-nitride-oxide (ONO) dielectric layer. The second dielectric layer 16 may be formed as a three-layered structure including a lower layer of insulator material, a middle layer of charge trapping material formed on the lower layer, and an upper layer of insulator material formed on the middle layer. In one embodiment, the lower layer comprises oxide, the middle layer comprises nitride formed on the lower layer, and the upper layer comprises oxide formed on the middle layer. Typically, the oxide comprises silicon dioxide, and the nitride comprises silicon nitride. The lower, middle, and upper layers are not shown in FIG. 2. The lower layer of the second dielectric layer 16 may be deposited or thermally grown on floating gate 14. Control gate 18 is formed upon second dielectric layer 16. Control gate 18 preferably comprises CVD deposited polysilicon. In a typical embodiment, a word line that extends in a left/right direction in FIG. 2 functions as control gate 18 for the illustrated memory device. Insulating material 15 may be formed adjacent to the stacked gate structure 8 and may overlie the drain/source regions 20.

The multiple layers formed upon substrate 10 are subjected to optical lithography and known etch techniques, e.g., plasma etch, to define stacked gate structure 8. The etch durations may be selected to terminate before substantial portions of substrate 10 can be removed. The sidewalls of stacked gate structure 8 tend to become damaged as a result of the etch. That is, the sidewalls can contain dangling bonds that may provide opportune bonding sites for deleterious contaminants. In one embodiment, dopants that are opposite in type to those in bulk substrate 10 are ion implanted into the substrate 10 and control gate 18. The ion implantation normally is self-aligned to the sidewalls of stacked gate structure 8 such that source/drain regions 20 are formed within the substrate 10 on opposing sides of stacked gate structure 8. The source/drain regions 20 may function as bit lines that extend into the plane of the diagram in FIG. 2.

Figure 3:
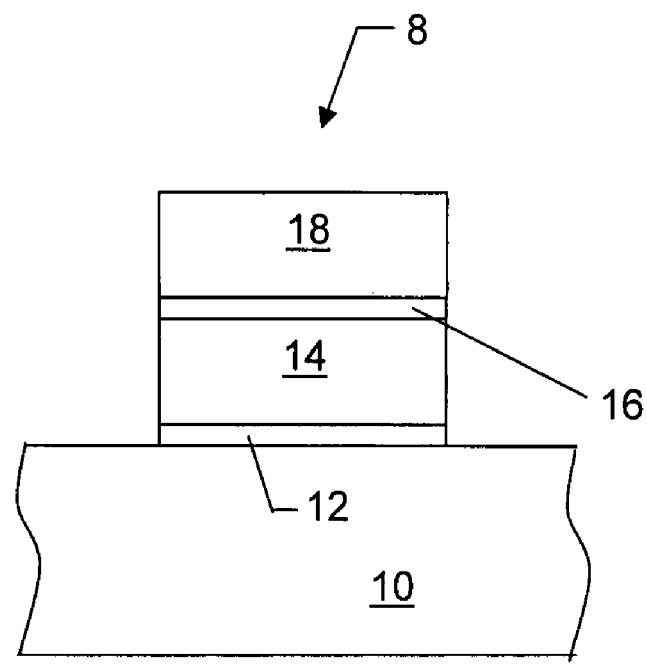
FIG. 3 is a cross-sectional view taken along the line B-B' of the stacked memory device of FIG. 1.

FIG. 3 is a cross-sectional view taken along section B-B' of the memory device illustrated in FIG. 1. In this view a word line that functions as a control gate 18 for the memory device extends into the plane of the diagram. The bit lines corresponding to source/drain regions 20 (FIG. 1) lie parallel to the plane of the diagram, extending leftward and rightward, and do not appear in the diagram. The remaining elements illustrated in FIG. 3 are described above in the discussion of FIG. 2.

Figure 4:
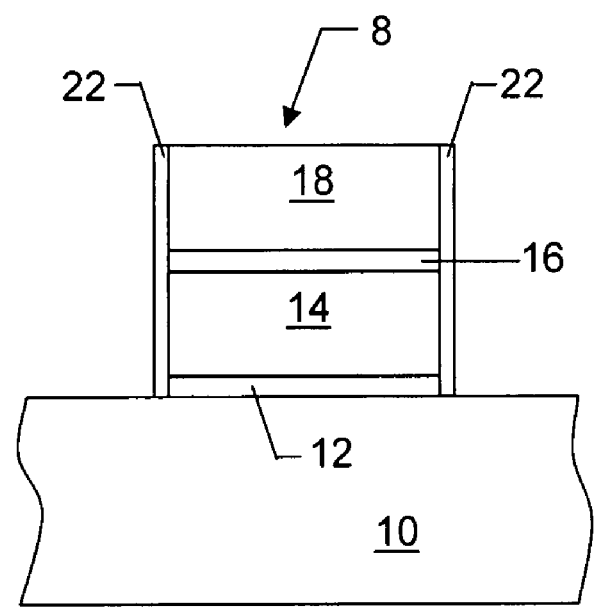
FIG. 4 is a cross-sectional view of the memory device depicted in FIG. 3, wherein a liner oxide layer is formed on the sidewalls of the stacked gate structure.

With reference to FIG. 4, a liner dielectric layer 22 is formed on sidewalls of stacked gate structure 8. In the illustrated embodiment, the liner dielectric layer 22 is formed on sidewalls which extend in a direction parallel to the control gate and which face substantially in the direction of the bit lines formed by source/drain regions 20 (FIG. 1). That is, the liner dielectric layer 22 faces a direction that is parallel to, and that may not substantially overlie, the source/drain regions 20. Liner dielectric layer 22 preferably comprises a thermally grown oxide that is formed by exposing stacked structure 8 to any conventional furnace thermal process or to any rapid thermal process. Alternatively, the stacked structure 8 may be exposed to thermal radiation and an oxygen-entrained gas. The formation of liner dielectric layer 22 can repair damage that may occur as a result of the etch step used to define the sidewalls of the stacked gate structure 8. It is believed that the oxygen can fill opportune bonding sites, i.e., dangling bonds that were created by the etch step, thereby blocking migration avenues into and out of the stacked gate structure 8. Therefore, it is less likely that foreign species can pass into and dopants can pass out of stacked gate structure 8 during subsequent exposures to thermal process.

Figure 5:
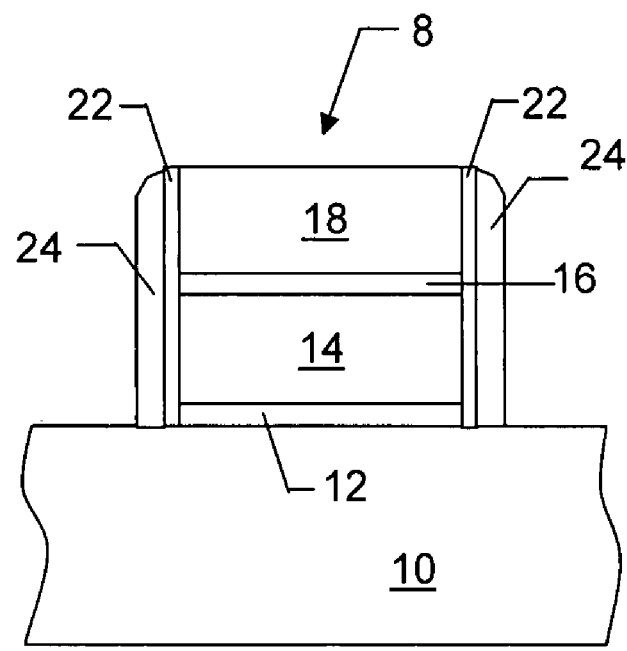
FIG. 5 is a cross-sectional view of the memory device depicted in FIG. 4, wherein a nitride barrier layer is formed on the liner oxide layer.

Turning to FIG. 5, a nitride barrier layer 24 is subsequently formed on at least part of the liner dielectric layer 22 to create an electron barrier adjacent to an edge of the tunnel oxide 12.

The nitride barrier layer 24, which may comprise silicon nitride, may be formed by a CVD process. Examples of CVD processes include low pressure CVD and plasma enhanced CVD. When a CVD process is employed, the thickness of the nitride layer should be larger than about 30 Å. In modified embodiments, other known nitridation processes may be used to form the nitride barrier layer 24. For example, nitride barrier layer 24 may be formed via a thermal nitridation process in a furnace. More particularly, liner oxide layer 22 may be heated in the presence of a nitrogen-containing gas (e.g., NO, $N_2$, $N_2O$ or $NH_3$), causing nitrogen atoms to adsorb on the surface of liner oxide layer 22 and bond with silicon atoms therein. Another method for forming nitride barrier layer 24 entails using Rapid Thermal Processing (RTP) to anneal the liner oxide layer 22 in the presence of NO, $N_2$, $N_2O$ or $NH_3$. Alternatively, nitride barrier layer 24 may be formed by exposing liner oxide layer 22 to a $N_2$ plasma. When a nitridation process is used, the nitride thickness should be larger than about 10 Å.

In accordance with an aspect of the present invention, the barrier layer 24 is formed adjacent to the edge of the tunnel oxide 12 to extend in a direction which is perpendicular to, and which does not substantially overlie, the source/drain regions 20. For example, in one embodiment, the barrier layer 24 does not underlie the word line that functions as the control gate 18 illustrated in FIG. 1. In the embodiment illustrated in FIG. 5, the barrier layer 24 is formed to extend above an edge of the tunnel oxide 12 in a direction away from the substrate 10, so that a maximum dimension of the barrier layer 24 extends substantially perpendicularly to the substrate 10. In a modified embodiment, the barrier layer 24 can be formed to extend away from the edge of the tunnel oxide 12 in a direction substantially parallel to the substrate 10, so that a maximum dimension of the barrier layer 24 extends in a direction substantially parallel to the substrate 10. In a further embodiment, the barrier layer 24 can be formed adjacent to an edge of the tunnel oxide 12 to extend both in a direction away from the substrate 10 and in a direction substantially parallel to the substrate 10.

As described previously, nitride barrier layer 24 can trap negative charge migrating between floating gate 14 and source/drain regions 20, thus inhibiting current leakage in the resulting non-volatile memory device. Therefore, the fast erase effect of the memory device can be reduced. In particular, the memory device may be programmed and erased for numerous cycles without the concern that the threshold voltage will drop significantly.

Figure 6:
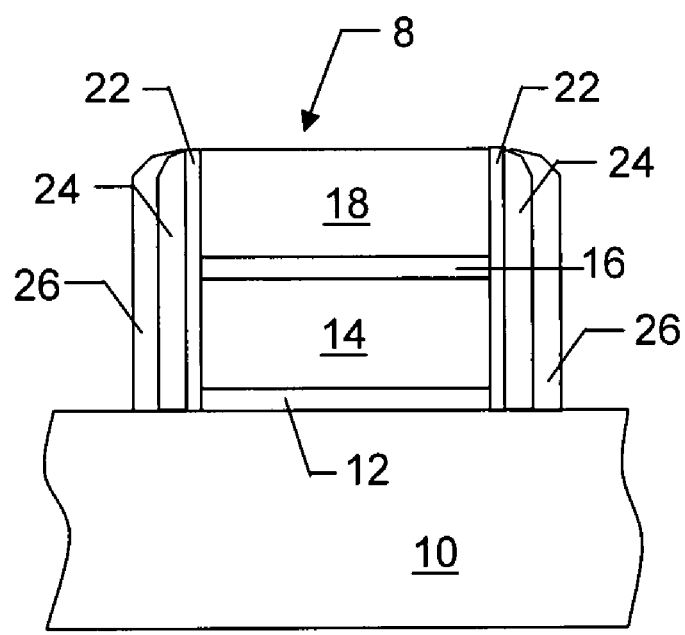
FIG. 6 is a cross-sectional view of the memory device depicted in FIG. 5, wherein an oxide spacer is formed on the nitride barrier layer.

Optionally, as shown in FIG. 6, a dielectric spacer 26 may be formed on nitride barrier layer 24. Dielectric spacer 26 may comprise any suitable isolating material known in the art. Preferably, dielectric spacer 26 is an oxide that is formed by CVD using a tetraethylorthosilicate (TEOS) source.

In some embodiments, the liner dielectric 22, the nitride barrier layer 24, and the dielectric spacer 26 may overlie portions of the source/drain regions 20 as illustrated in FIG. 1. Alternatively, extra process steps may be provided to remove portions of the liner dielectric 22, the nitride barrier layer 24, and/or the dielectric spacer 26 that lie above the source/drain regions 20. In any case, according to an aspect of the present invention, the liner dielectric 22, the nitride barrier layer 24, and the dielectric spacer 26 should be disposed to cover and protect the sidewalls of the floating gate 14 as illustrated in FIG. 6.

EXAMPLE

Figure 7:
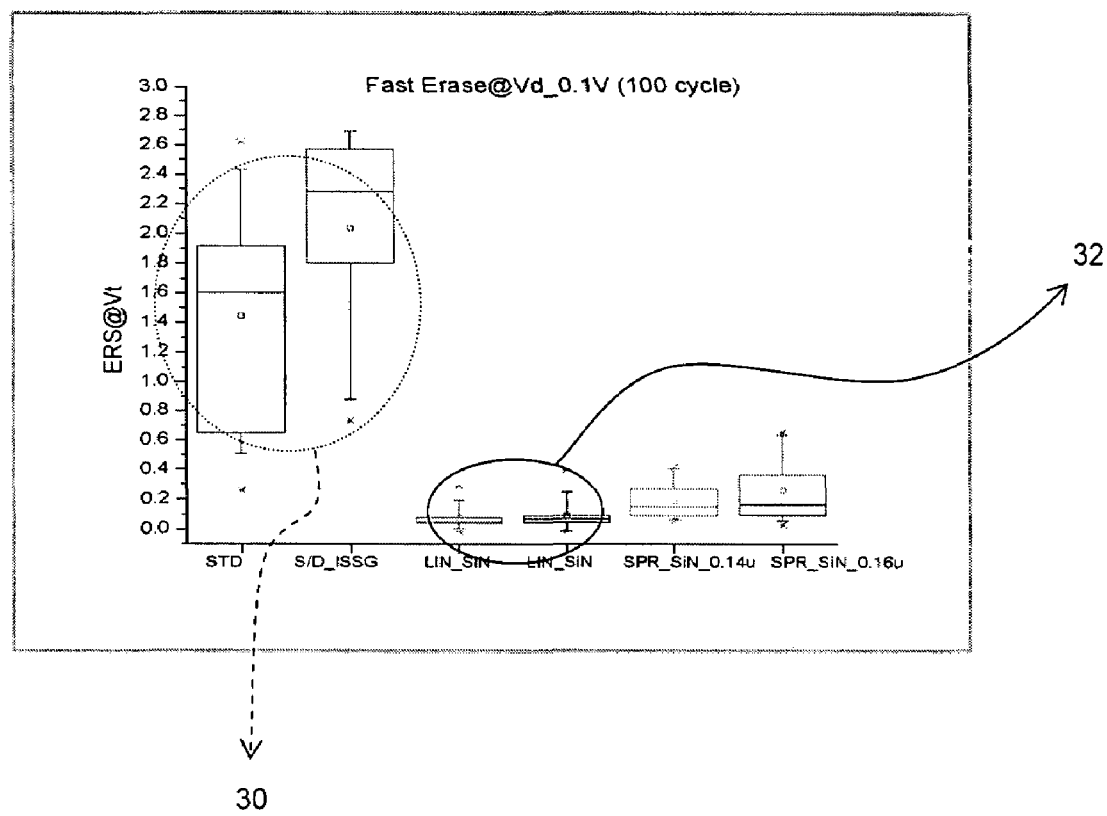
FIG. 7 is a graph illustrating the threshold voltage difference between the initial erase and the erase cycle after 100 cycles for the non-volatile memory device of the present invention.

Several samples of a non-volatile memory device having a 200 Å nitride barrier layer were formed in accordance with the present invention. Samples of a conventional non-volatile memory device were also formed for comparison purposes. All samples were then subjected to 100 cycles of programming and erasing. The threshold voltage difference between the initial erase and the erase after 100 cycles was determined for each sample. FIG. 7 depicts a plot of the voltage differences for the conventional samples 30 and the samples 32 of the present invention. Conventional samples 30 exhibited voltage differences that are much greater than those exhibited by samples 32.

The above-described embodiments have been provided by way of example, and the present invention is not limited to these examples. Multiple variations and modification to the disclosed embodiments will occur, to the extent not mutually exclusive, to those skilled in the art upon consideration of the foregoing description. Such variations and modifications, however, fall well within the scope of the present invention as set forth in the following claims.

What is claimed is:

1. A memory device formed on a substrate, the memory device comprising:
    a stacked structure including:
        a first dielectric layer disposed on the substrate;
        a floating gate disposed on the first dielectric layer;
        a second dielectric layer disposed on the floating gate;
        a control gate disposed on the second dielectric layer;
        a liner dielectric layer formed on sidewalls of the stacked structure which extend in a direction parallel to the control gate; and
        a barrier layer formed on at least part of the liner dielectric layer for trapping charges, the barrier layer being formed to extend in a direction that does not overlie a source/drain region of the memory device.

2. The memory device as set forth in claim 1, wherein the barrier layer is formed to extend above an edge of the first dielectric in a direction away from the substrate.

3. The memory device as set forth in claim 2, wherein a maximum dimension of the barrier layer extends substantially perpendicularly to the substrate.

4. The memory device as set forth in claim 1, wherein the barrier layer is formed adjacent to an edge of the first dielectric.

5. The memory device as set forth in claim 4, wherein the barrier layer is formed to extend away from the edge of the first dielectric in a direction substantially parallel to the substrate.

6. The memory device as set forth in claim 5, wherein a maximum dimension of the barrier layer extends in a plane that is substantially parallel to the substrate.

7. The memory device as set forth in claim 6, wherein the barrier layer is further formed to extend above the edge of the first dielectric in a direction away from the substrate.

8. The memory device as set forth in claim 7, wherein a maximum dimension of the barrier layer extends in a direction substantially perpendicular to the substrate.

9. The memory device as set forth in claim 1, wherein the second dielectric layer comprises;
    a lower layer of insulator material;
    a middle layer of charge trapping material formed on the lower layer; and
    an upper layer of insulator material formed on the middle layer.

10. The memory device as set forth in claim 1, wherein the second dielectric layer comprises:
    a lower layer of oxide;
    a middle layer of nitride formed on the lower layer; and
    an upper layer of oxide formed on the middle layer.

11. The memory device as set forth in claim 1, wherein the liner dielectric and the barrier layer are formed to extend over source/drain regions of the memory device.

12. The memory device as set forth in claim 1, further comprising a dielectric spacer formed on the barrier layer.

13. The memory device as set forth in claim 1, wherein the barrier layer comprises silicon nitride.

* * * * *